US012571848B2

(12) United States Patent
Just et al.

(10) Patent No.: US 12,571,848 B2
(45) Date of Patent: Mar. 10, 2026

(54) METHOD FOR MONITORING THE STATE OF CHARGE OF A TRACTION BATTERY AND HYBRID VEHICLE

(71) Applicant: Mercedes-Benz Group AG, Stuttgart (DE)

(72) Inventors: Michael Just, Calw (DE); Marcel Dobelmann, Simmozheim (DE); Ruediger Johann Hollaus, Bad Urach (DE)

(73) Assignee: Mercedes-Benz Group AG, Stuttgart (DE)

( * ) Notice: Subject to any disclaimer, the term of this patent is extended or adjusted under 35 U.S.C. 154(b) by 634 days.

(21) Appl. No.: 18/068,706

(22) Filed: Dec. 20, 2022

(65) Prior Publication Data

US 2023/0213588 A1 Jul. 6, 2023

(30) Foreign Application Priority Data

Jan. 3, 2022 (DE) ..................... 10 2022 000 025.3

(51) Int. Cl.
*G01R 31/387* (2019.01)
*B60W 40/12* (2012.01)
*G01R 31/367* (2019.01)

(52) U.S. Cl.
CPC ........... *G01R 31/387* (2019.01); *B60W 40/12* (2013.01); *G01R 31/367* (2019.01); *B60W 2510/244* (2013.01)

(58) Field of Classification Search
CPC ..... G01R 31/387; G01R 31/367; B60L 53/20; B60L 58/12; B60L 58/16
USPC .......................................... 320/132
See application file for complete search history.

(56) References Cited

U.S. PATENT DOCUMENTS

2022/0024323 A1* 1/2022 Kresse, III .............. B60L 53/35

FOREIGN PATENT DOCUMENTS

DE 10 2014 203 417 A1 8/2015

* cited by examiner

*Primary Examiner* — Nathaniel R Pelton
(74) *Attorney, Agent, or Firm* — Crowell & Moring LLP

(57) ABSTRACT

A method for monitoring the state of charge of a traction battery of a hybrid vehicle includes comparison of an actual state of charge with a state of charge limit value. If an initial actual state of charge lies above the state of charge limit value, waiting for a debounce time and output of a positive testing if the actual state of charge still lies above the state of charge limit value. If the initial actual state of charge lies below the state of charge limit value, continuous calculating of a model state of charge and output of a positive testing if the model state of charge reaches the state of charge limit value and does not fall short of it again for at least the debounce time.

7 Claims, 3 Drawing Sheets

METHOD FOR MONITORING THE STATE OF CHARGE OF A TRACTION BATTERY AND HYBRID VEHICLE

CROSS REFERENCE TO RELATED APPLICATION

This application claims priority under 35 U.S.C. § 119 from German Patent Application No. DE 10 2022 000 025.3, filed Jan. 3, 2022, the entire disclosure of which is herein expressly incorporated by reference.

BACKGROUND AND SUMMARY OF THE INVENTION

The invention relates to a method for monitoring the state of charge of a traction battery of a hybrid vehicle and to a hybrid vehicle for carrying out the method.

Hybrid vehicles typically have an internal combustion engine and an electric motor as a drive machine. A hybrid vehicle has one or several traction batteries to provide energy to the electric motor. The traction battery can be charged during the journey with the hybrid vehicle via a generator connected to the internal combustion engine. In the case of so-called plugin hybrid vehicles, the traction battery can also be charged by means of a charging station.

The traction battery is typically not fully discharged during the operation of the hybrid vehicle, but rather a certain remaining charge is retained in the traction battery so that the hybrid vehicle can carry out standing functions when it is parked. Examples of these are, for example, the re-charging of a 12 V battery, advance air conditioning of the vehicle interior and/or the retention of sufficient energy reserves to be able to carry out a start of the motor. The traction battery additionally constantly discharges with a longer standing time. This can lead to not enough electrical energy being present in the traction battery after the renewed start of the hybrid vehicle in order to be able to provide all relevant hybrid functions. It is thus necessary to monitor the state of charge of the traction battery in order to be able to make an assertion as to whether the system components of the hybrid vehicle are functioning correctly, so that the traction battery is sufficiently charged during the operation of the internal combustion engine in the event of an insufficient state of charge of the traction battery.

The charging power that can be used to charge the traction battery is dependent on the mode of operating of the hybrid vehicle, and can be reduced in particular driving situations in relation to a standard value. If the hybrid vehicle is driving on an incline, for example, and/or is accelerating excessively, then the electric motor can be connected to the drive train of the hybrid vehicle to support the internal combustion engine, whereby no or only a reduced charging power is available. It is thus unclear for a duration after the hybrid vehicle starts whether an excessively slow charging of the traction battery results from the mode of operating of the hybrid vehicle or from a defect of the system components of the hybrid vehicle.

DE 10 2014 203 417 A1 discloses a method for monitoring a state of charge of the traction battery of a hybrid vehicle. The cold start capability of the hybrid vehicle at low surrounding temperatures is ensured by means of the method disclosed in the document. A state of charge limit for the traction battery is defined here, which must not be fallen short of, so that the hybrid vehicle can still start at low surrounding temperatures. The state of charge limit is here dependent on the temperature. Surrounding temperatures can for example be derived from a weather forecast.

The object of the present invention is to provide an improved method for monitoring the state of charge of a traction battery of a hybrid vehicle, by means of which an assertion can be made particularly quickly and easily as to whether the drive system of the hybrid vehicle consisting of internal combustion engine, electric motor, generator, traction battery and control device is functioning correctly, so that a sufficient charging of the traction battery is possible in proper time in the event of an insufficient state of charge of the traction battery of the hybrid vehicle.

In a method for monitoring the state of charge of a traction battery of a hybrid vehicle after the internal combustion engine of the hybrid vehicle of the kind specified in the introduction is started, at least one actual state of charge is monitored depending on a determined state of charge limit value, wherein the following method steps are carried out according to the invention:

- comparison of the actual state of charge with the state of charge limit value;
- if an initial actual state of charge lies above the state of charge limit value: waiting for a debounce time and output of a positive testing if the actual state of charge still lies above the state of charge limit value after the debounce time has elapsed; or output of a negative testing, if the actual state of charge has sunk below the state of charge limit value after the debounce time has elapsed; or
- if the initial actual state of charge lies below the state of charge limit value: continuous calculation of a model state of charge, taking into account a modeled charging current dependent on a modeled charging power depending on a driving situation, wherein a starting value of an initial model state of charge is determined via a subtraction from the initial actual state of charge minus a determined safety difference, and output of a positive testing if the model state of charge reaches the state of charge limit value and does not fall short of it again for at least the debounce time; and/or output of a negative testing if the model state of charge exceeds the actual state of charge for at least the debounce time for an actual state of charge lying below the state of charge limit value.

By means of the method according to the invention it is possible to make an assertion particularly quickly and reliably as to whether the system components of the hybrid vehicle are functioning with sufficient reliability for the traction battery of the hybrid vehicle to be charged sufficiently during operation of the internal combustion engine.

The determined state of charge limit value is here dependent on the embodiment of the hybrid vehicle. The larger the electric drive machine, i.e., the more drive power it can provide, and the smaller the traction battery, i.e., the lower its capacity, the higher the state of charge limit value must be set so that a sufficient electrical energy reserve can be retained in the traction battery when the hybrid vehicle is parked. If the state of charge limit value is fallen short of, then all relevant hybrid driving functions, such as "boosting", and thus supporting the internal combustion engine by the electric motor, for example in an overtaking process, or driving the hybrid vehicle using the electric drive machine alone, can no longer be provided by the hybrid vehicle. If the state of charge of the traction battery lies above the state of charge limit value, then the hybrid driving functions can be used to their full extent.

The actual state of charge here describes the current state of charge of the traction battery. The initial actual state of charge is here the actual state of charge that is present after the hybrid vehicle is started.

A computing unit of the hybrid vehicle monitors the actual state of charge of the traction battery and compares the initial actual state of charge after the hybrid vehicle is started with the state of charge limit value. Depending on the pre-set desired mode of operation and the level of the actual state of charge, either the electric motor can be started in order to carry out a purely electrified operation of the hybrid vehicle, or alternatively the internal combustion engine can be started in order to provide a hybrid driving mode or in order to charge the traction battery. If the initial actual state of charge lies above the state of charge limit value, and if it does not fall short of it after the debounce time elapses, then the computing unit outputs a positive testing. The positive testing corresponds to a notification that means a correct mode of functioning of the system components of the hybrid vehicle, whereby the use of hybrid vehicle functions is possible in continuing operation of the hybrid vehicle. If, however, the actual state of charge falls short of the state of charge limit value after the debounce time has elapsed, then the computing unit outputs the negative testing, which means that the traction battery still has to be charged before a use of the hybrid drive functions.

For initial actual states of charge greater than the state of charge limit value, the debounce time results from the time that the drive system of the hybrid vehicle having a pre-defined base charging power would need to charge from a defined minimum state of charge to the state of charge limit value. The debounce time is thus calculated from the equation: debounce time=state of charge difference: 100× capacity of the traction battery: charging current. The charging current here results from the equation charging current=determined charging power: actual voltage.

If, however, the initial actual state of charge lies under the state of charge limit value, then the computing unit calculates the model state of charge. The model state of charge can be regarded as an idealized state of charge of the traction battery that would have to be set due to the currently present mode of operation of the hybrid vehicle. The actual state of charge will typically increase faster than the model state of charge, for example due to recuperative energy recovery that is used to charge the traction battery. If, however, the model state of charge is faster than the actual state of charge, then this indicates a defect of the system components of the hybrid vehicle. If the model state of charge reaches the state of charge limit value, then the computing unit correspondingly outputs a positive testing if the model state of charge has not fallen under the state of charge limit value after the debounce time has elapsed. The model state of charge can exclusively increase here, and remains at the state of charge limit value when it is reached. If the model state of charge exceeds the actual state of charge at least for the duration of the debounce time, then the computing unit outputs a negative testing, which means the same thing as a defect of the system components of the hybrid vehicle, as the traction battery charges slower than it actually should.

A current strength presently actually obtained from the traction battery is taken into account to calculate the actual state of charge. As already mentioned, this depends on the currently usable charging power. An estimated model current strength, and thus the modeled charging current, is taken into account for calculating the model charging state, for which a currently expected charging power and charging voltage is analogously modeled. The operating strategy of the hybrid vehicle can provide for limiting the charging power depending on the current driving situation. This leads the model charging state to increase slower. The charging power can however never fall below a minimum charging power. The charging current is additionally limited to a value that depends on the physical power uptake ability of the traction battery and the traction battery temperature.

If at least one critical measured value and/or signal is already detected from a quantity of measured values and or signals permanently checked by a monitor when the hybrid vehicle is started, e.g., an invalid battery state of charge signal, a defect of the electric drive machine, of the traction battery, of the traction battery temperature probe, an activated so-called "limp home mode", a critical air pressure being fallen short of or the like, then the monitor is deactivated without the method according to the invention being carried out.

An advantageous development of the invention provides that the model state of charge is calculated incrementally. This facilitates a particularly easy and reliable calculation of the model state of charge. The current model state of charge is thus calculated from the model state of charge at the immediately preceding point in time plus the current charging current times a time difference divided by the capacity of the traction battery times 100 percent. The charging current used in this formula is here estimated by the computing unit depending on the driving situation. An estimated charging power thus results from the driving situation, the estimated charging power being divided by the used charging voltage to calculate the estimated charging current.

According to a further advantageous embodiment of the method, the model state of charge is updated to the actual state of charge with a determined update difference as soon as the actual state of charge increases more significantly with a determined offset than the model state of charge. As already mentioned, the actual state of charge will generally increase faster than the model state of charge. The model state of charge is updated to the actual state of charge in order to still reach the output of the positive testing at sufficient speed, such that the model state of charge also increases sufficiently quickly. The update difference can here be selected depending on the embodiment of the hybrid vehicle, and thus the driving power of the electric drive machine and the capacity of the traction battery. In other words, the model state of charge is then always at least as great as the actual state of charge minus the update difference.

A further advantageous embodiment of the method further provides that the debounce time is shortened every time the actual state of charge increases again to a level above the model state of charge after the actual state of charge has been exceeded by the model state of charge, wherein the debounce time is only shortened if the actual state of charge starts out below the state of charge limit value. An initial debounce time is a value that can be made a parameter in this case. The negative testing is output after the debounce time has elapsed if the model charging state lies above the actual state of charge. If the model state of charge falls below the actual state of charge again, then the output of the negative testing can be set. If the model state of charge then increases to above the actual state of charge again, then the renewed output of the negative testing can thus be required after the debounce time elapses. This leads to an oscillating system, which is also described as "toggling". Short fluctuations can thus be disregarded by shortening the debounce time until the negative testing is output after the actual state of charge is exceeded by the model state of charge. It can thus be ensured that an error notification is output after the nth instance of toggling.

Corresponding to a further advantageous embodiment of the method according to the invention, the calculation of the model state of charge is paused for windows of time in which the traction battery is not going to be charged. If the traction battery is not charged then the requirement to monitor the system components of the hybrid vehicle in a correct mode of functioning lapses. The model state of charge correspondingly also does not need to be calculated. The traction battery is not charged if so-called "SOC rising conditions" are not fulfilled. This is for example the case if the internal combustion engine of the hybrid vehicle is standing, the operating strategy of the hybrid vehicle provides a limiting of the electrical drive machine with regards to the generator and/or the operating strategy provides a maximum boosting.

A further advantageous embodiment of the method according to the invention further provides that the model state of charge proceeds from a newly calculated initial model state of charge when the charging process of the traction battery is resumed. The newly calculated initial model state of charge is here calculated with the same formula as the original initial model state of charge. This means that the safety difference is subtracted from the current actual state of charge in order to determine the newly calculated initial model state of charge. This can also be described in other words as "resetting" the calculation of the model state of charge after the charging process of the traction battery is resumed. This ensures that an unrealistic model state of charge is not calculated.

It is preferably shown directly on the monitor after the internal combustion engine of the hybrid vehicle is started if an OBD-relevant system error is recognized in the drive train of the hybrid vehicle. The invention presented here, however, is then switched off without a testing result. As already mentioned, different diagnostic data can be analyzed by the computing unit to recognize a system defect. If a system error has already been output, then carrying out the method according to the invention is also no longer necessary, as a system defect has already been determined. If this is not the case, however, then indications of further potential system defects can be recognized by means of the method according to the invention, which allows a particularly comprehensive monitoring of the system components of the hybrid vehicle, and thus in particular the internal combustion engine, electric drive machine/generator, traction battery and the like.

In the case of a hybrid vehicle having a traction battery, an electric drive machine, an internal combustion engine and a control device, the aforementioned system components are equipped to carry out a method described above according to the invention. The hybrid vehicle can be any kind of vehicle, such as a passenger vehicle, a heavy goods vehicle, a transporter, a bus or the like. The hybrid vehicle can also be embodied as a plugin hybrid. The control device here takes on the tasks of the computing unit. The computing unit thus coordinates the charging process of the traction battery, and monitors the same. The electric drive machine can also be operated in a generator mode in order to charge the traction battery. However, a separate generator can also be provided for this purpose.

Further advantageous embodiments of the method according to the invention for monitoring the state of charge of the traction battery result from the exemplary embodiments that are described in the following with reference to the figures.

DETAILED DESCRIPTION OF THE DRAWINGS

Figure 1:
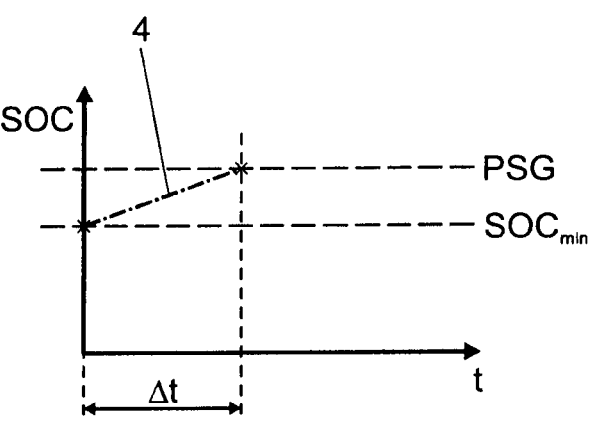
FIG. 1 shows a state of charge diagram of a traction battery of a hybrid vehicle according to the invention for depicting the determination of a debounce time.

FIG. 1 shows a state of charge diagram that serves to depict the determination of a debounce time $\Delta t$. The time t is here plotted on the abscissa of the state of charge diagram, and the state of charge SOC of a traction battery of a hybrid vehicle is plotted on the ordinate. The state of charge diagrams shown in FIGS. 1 to 7 are depicted in a purely qualitative embodiment.

A minimum state of charge $SOC_{min}$, that is never fallen short of by the hybrid vehicle due to removal of electrical energy from the traction battery is depicted. Falling short of the minimum state of charge $SOC_{min}$, ought to be prevented in order to prevent damage to the cells of the traction battery. The minimum state of charge $SOC_{min}$, is a comparatively low state of charge, for example in the region of 0.1 to 5 percent of the entire capacity of the traction battery. In a 28-volt system, even 25 percent is possible here as a minimum state of charge $SOC_{min}$. The minimum state of charge $SOC_{min}$, can be fallen short of, however, if the traction battery is not charged for a longer time in the event of a low state of charge, and thus due to self-discharging.

A state of charge limit value PSG and a base state of charge 4 are further marked in the state of charge diagram in FIG. 1. In the event of a state of charge SOC below the state of charge limit value PSG, not all the hybrid functions of the hybrid vehicle can be used, such as, for example, the purely battery-electric drive of the hybrid vehicle, or boosting to increase a drive power in the combustion driving mode. In the event of a state of charge SOC above the state of charge limit value PSG, on the other hand, all hybrid driving functions can be used.

The state of charge limit value PSG can also be described as a project-specific limit value, as it depends on the embodiment of the hybrid vehicle, in particular on the capacity of the traction battery and the consumption of the hybrid vehicle.

The charging of the traction battery occurs starting from the minimum state of charge $SOC_{min}$, according to the base state of charge 4 having a pre-defined base charging power that corresponds to the lowest charging power that can be provided during the operation of the hybrid vehicle. The debounce time $\Delta t$ here results from the elapsed duration for charging the traction battery from the minimum state of charge $SOC_{min}$, to the state of charge limit value PSG with the base charging power.

Figure 2:
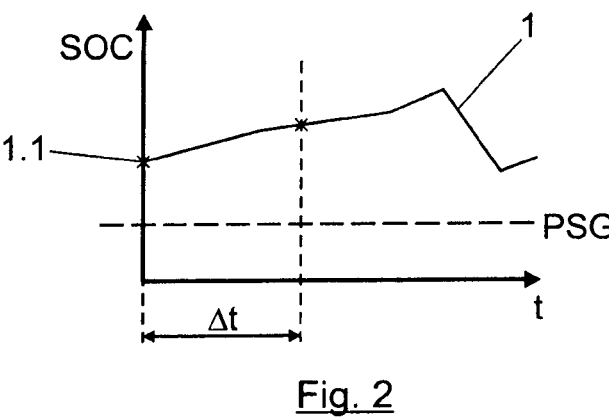
FIG. 2 shows a state of charge diagram of a sufficiently charged traction battery whose state of charge is moving within permitted parameters.

In FIG. 2, the state of charge diagram of a sufficiently charged traction battery is shown, which is further charged during the operation of the hybrid vehicle. An actual state of charge 1 thus moves in the direction of a higher state of charge SOC starting from an initial actual state of charge 1.1 until electrical energy is removed from the traction battery, for example for boosting. A method according to the invention for monitoring the state of charge of the traction battery is carried out after the hybrid vehicle is started and after the internal combustion engine is started. As the actual state of charge 1 lies above the state of charge limit value PSG after the debounce time $\Delta t$ has elapsed, a computing unit that monitors the state of charge outputs a positive testing. The positive testing is thus a signal confirming that the system components of the hybrid vehicle are working correctly.

Figure 3:
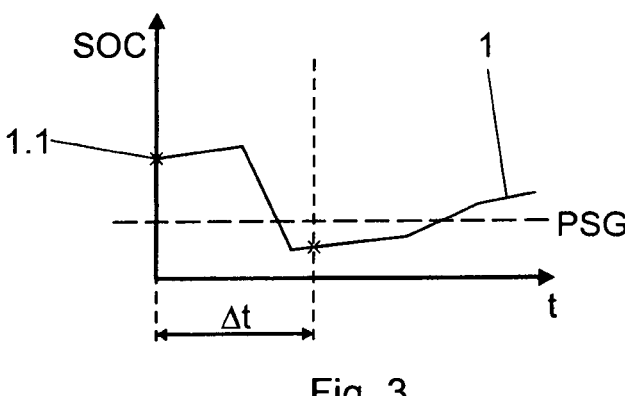
FIG. 3 shows a state of charge diagram of a sufficiently charged traction battery whose state of charge is moving outside of permitted parameters.

In FIG. 3, on the other hand, the actual state of charge 1 has fallen below the state of charge limit value PSG after the debounce time $\Delta t$ has elapsed. Not all the hybrid vehicle functions can thus be used, for which reason the computing unit outputs a negative testing. The negative testing thus corresponds to an indicator that the system components of the hybrid vehicle have a defect or are being operated outside of the provided parameters.

Figure 4:
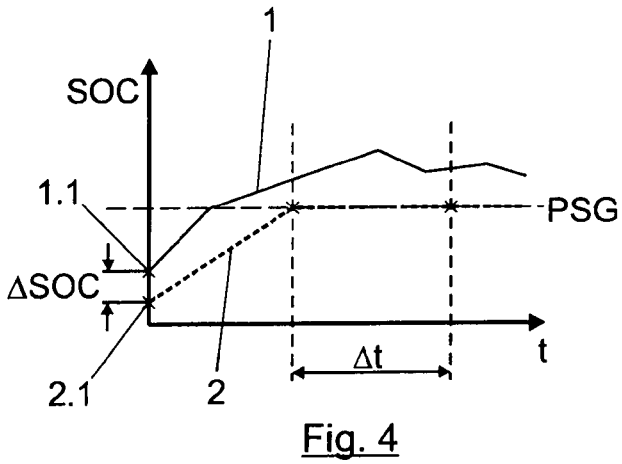
FIG. 4 shows a state of charge diagram for an insufficiently charged traction battery whose state of charge is charged to a sufficient level according to provided parameters.

FIG. 4 shows a state of charge diagram of an insufficiently charged traction battery. The initial actual state of charge 1.1 here lies below the state of charge limit value PSG. If this is the case, then a model state of charge 2 is calculated according to the method according to the invention. This model state of charge starts from an initial model state of charge 2.1 that results from subtraction from the initial actual state of charge 1.1 with a safety difference $\Delta SOC$. FIG. 4 shows the case of the traction battery being charged according to provided operating parameters. The actual state of charge 1 and the model state of charge 2 here increase continuously. The actual state of charge 1 will here typically increase more significantly than the model state of charge 2. As soon as the model state of charge 2 reaches the state of charge limit value PSG, the model state of charge remains stuck at this value. As soon as the state of charge limit value PSG is reached, the debounce time $\Delta t$ begins to run. If the model state of charge 2 does not fall short of the state of charge limit value PSG over the further course, then the computing unit outputs a positive testing.

Figure 5:
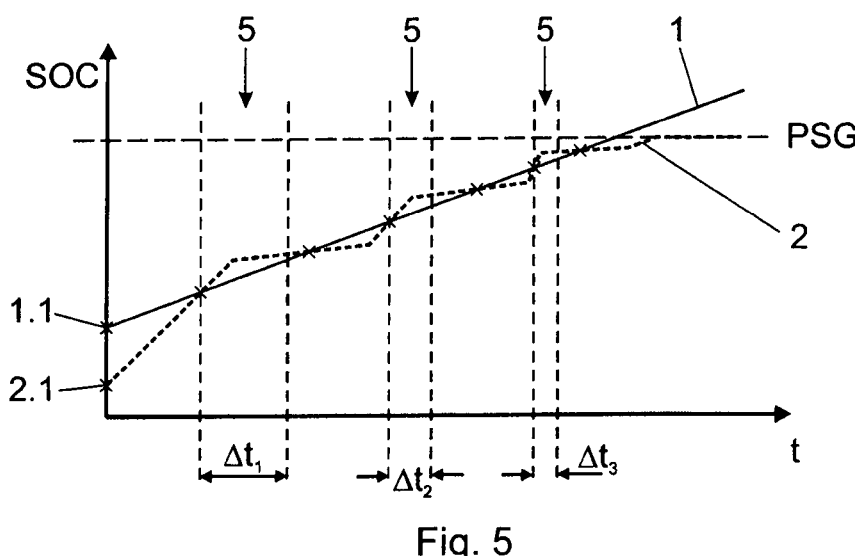
FIG. 5 shows a state of charge diagram of an insufficiently charged traction battery whose state of charge monitoring suggests an indication for the presence of a defect.

A defect of the traction battery or of the electronic components of the electrified part of the drive train of the hybrid vehicle, for example a defect of the battery management system, can lead to the traction battery being charged slower than ought to occur according to expected currently present conditions. This case is depicted in FIG. 5. FIG. 5 thus shows three regions 5 in which the model state of charge 2 lies above the actual state of charge 1. If the duration for which the model state of charge 2 exceeds the actual state of charge 1 is here respectively at least the debounce time $\Delta t$, as shown in FIG. 5, then the computing unit outputs the negative testing. According to an advantageous embodiment of the method according to the invention, the debounce time is shortened every time this is the case. A first, second and third debounce time $\Delta t_1$, $\Delta t_2$, $\Delta t_3$ are correspondingly depicted in FIG. 5, wherein the second debounce time $\Delta t_2$ is shorter than the first debounce time $\Delta t_1$, and the third debounce time $\Delta t_3$ is shorter than the second debounce time $\Delta t_2$.

Figure 6:
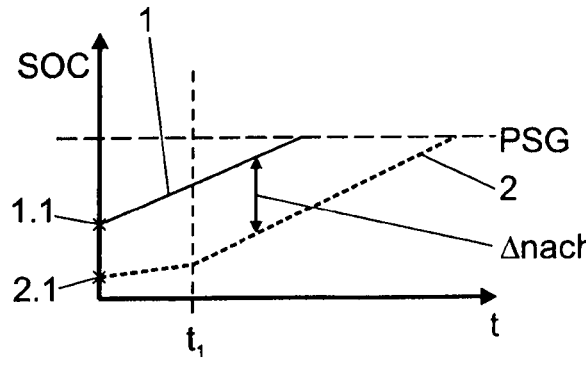
FIG. 6 shows a state of charge diagram of an insufficiently charged traction battery in which a model state of charge is updated to an actual state of charge.

The certification of hybrid vehicles can require that the positive testing must be output within a comparatively short duration. This can be guaranteed in the event of an insufficiently charged traction battery according to an advantageous development of the method according to the invention by the model state of charge 2 being updated to the actual state of charge 1 if the actual state of charge 1 increases more significantly by a certain factor than the model state of charge 2. In other words, the model state of charge 2 is updated to the actual state of charge 1 if the increase of the actual state of charge 1 is greater than the model state of charge 2 by a particular offset. Any factor can here be selected. In FIG. 6, this case is depicted, wherein the model state of charge 2 is updated to the actual state of charge 1 with an update difference of $\Delta SOC$. The computing unit has here recognized at point in time $t_1$ that the increase of the actual state of charge 1 is greater than the increase of the model state of charge 2 by the offset.

Figure 7:
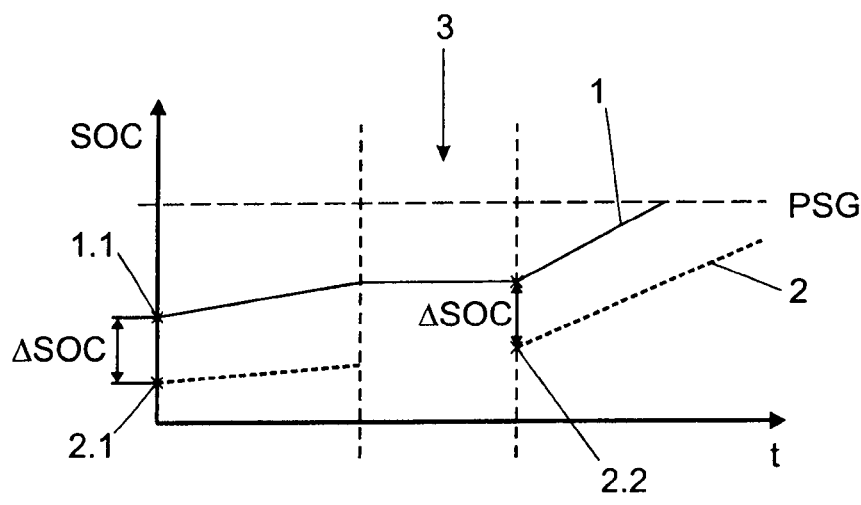
FIG. 7 shows a state of charge diagram for an insufficiently charged traction battery for which the charging process of the traction battery is rightly briefly interrupted.

FIG. 7 shows the case of the charging process of the traction battery being briefly interrupted. FIG. 7 thus shows a window of time 3 in which the traction battery will not be charged, and the actual state of charge 1 thus runs horizontally. In this case, it is not required to calculate the model state of charge 2. If the traction battery is charged again, then a new model state of charge 2 is calculated having a newly calculated initial model state of charge 2.2 that is calculated analogously to the initial model state of charge 2.1 from the difference calculated between the initial actual state of charge 1.1 and the safety difference $\Delta SOC$. The actual state of charge 1 is here used as an output value that is present at the end of the window of time 3.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for monitoring a state of charge (SOC) of a traction battery of a hybrid vehicle after an internal combustion engine usable as a drive machine is started, comprising the steps of:

monitoring an actual state of charge (1) depending on a determined state of charge limit value (PSG);

comparing the actual state of charge (1) with the state of charge limit value (PSG);

if an initial actual state of charge (1.1) lies above the state of charge limit value (PSG): waiting for a debounce time ($\Delta t$) and output of a positive testing if the actual state of charge (1) still lies above the state of charge limit value (PSG) after the debounce time ($\Delta t$) has elapsed or output of a negative testing if the actual state of charge (1) has sunk below the state of charge limit value (PSG) after the debounce time ($\Delta t$) has elapsed;

if the initial actual state of charge (1.1) lies below the state of charge limit value (PSG): continuously calculating a model state of charge (2) taking into account a modeled charging current dependent on a modeled charging power depending on a driving situation, wherein a starting value of an initial model state of charge (2.1) is determined by establishing a difference between the initial actual state of charge (1.1) minus a determined safety difference ($\Delta$SOC), and output of a positive testing if the model state of charge (2) reaches the state of charge limit value (PSG) and does not fall below it again for at least the debounce time ($\Delta$t) and/or output of a negative testing if the model state of charge (2) exceeds the actual state of charge (1) for at least the debounce time ($\Delta$t) for an actual state of charge (1) lying below the state of charge limit value (PSG); and charging the traction battery when the actual state of charge (1) falls short of the state of charge limit value (PSG).

2. The method according to claim 1, wherein the model state of charge (2) is calculated incrementally.

3. The method according to claim 1, wherein the model state of charge (2) is updated to the actual state of charge (1) with a determined update difference ($\Delta$nach) as soon as the actual state of charge (1) increases more significantly with a determined offset than the model state of charge (2).

4. The method according to claim 1, wherein the debounce time ($\Delta$t) is shortened every time the actual state of charge (1) increases again to a level above the model state of charge (2) after the actual state of charge (1) has been exceeded by the model state of charge (2).

5. The method according to claim 1, wherein the calculation of the model state of charge (2) is paused for windows of time (3) in which the traction battery is not going to be charged.

6. The method according to claim 5, wherein the model state of charge (2) proceeds from a newly calculated initial model state of charge (2.2) when the charging process of the traction battery is resumed.

7. A hybrid vehicle, comprising:

a traction battery;

an electric drive machine;

an internal combustion engine; and a control device;

wherein the traction battery, the electric drive machine, the internal combustion engine, and the control device are configured to carry out the method according to claim 1.

\* \* \* \* \*